US007760314B2

United States Patent
Iwanaga et al.

(10) Patent No.: US 7,760,314 B2
(45) Date of Patent: Jul. 20, 2010

(54) DISPLAY DEVICE

(75) Inventors: Hirofumi Iwanaga, Kumamoto (JP);
Shigeaki Noumi, Kumamoto (JP);
Hitoshi Morishita, Kumamoto (JP);
Hiroshi Ueda, Kumamoto (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 474 days.

(21) Appl. No.: 11/585,801

(22) Filed: Oct. 25, 2006

(65) Prior Publication Data

US 2007/0040980 A1 Feb. 22, 2007

Related U.S. Application Data

(62) Division of application No. 10/859,242, filed on Jun. 3, 2004, now abandoned.

(30) Foreign Application Priority Data

Jun. 5, 2003 (JP) ............... 2003-160719

(51) Int. Cl.
*F02F 1/1345* (2006.01)
(52) U.S. Cl. ...................... 349/149; 349/150
(58) Field of Classification Search .......... 349/149–152
See application file for complete search history.

(56) References Cited

U.S. PATENT DOCUMENTS

| 4,955,695 | A | 9/1990 | Kubo et al. |
| 5,737,053 | A | 4/1998 | Yomogihara et al. |
| 6,448,663 | B1 | 9/2002 | Uschyama |
| 6,583,844 | B1 | 6/2003 | Mishima et al. |
| 6,686,987 | B1 * | 2/2004 | Sakaki et al. ............... 349/149 |
| 7,453,428 | B2 | 11/2008 | Imajo et al. |

FOREIGN PATENT DOCUMENTS

| JP | 2-238643 | 9/1990 |
| JP | 03-222348 | 10/1991 |

(Continued)

OTHER PUBLICATIONS

U.S. Appl. No. 11/585,802, filed Oct. 25, 2006, Iwanaga et al.

*Primary Examiner*—Dung T. Nguyen
(74) *Attorney, Agent, or Firm*—Oblon, Spivak, McClelland, Maier & Neustadt, L.L.P.

(57) ABSTRACT

The present invention provides a display device which has a narrow screen border, and excellent display equality. The display device according to the present invention comprises a display panel comprising a glass substrate and a source driver IC which is provided along the edge of the glass substrate. The FPC is connected between the source driver ICs. At the substrate end side of the source driver IC, a bump for GND, a bump for analog power supply, a bump for digital power supply, a bump for reference voltage at the positive polarity side, and a bump for reference voltage at the negative polarity side are formed sequentially from the outer side along the flow of current. These bumps for input and the FPC are connected with the lines for input on the glass substrate. The logic signal lines and are formed along the short side of the source driver IC and along the long side at the display area side.

11 Claims, 11 Drawing Sheets

FOREIGN PATENT DOCUMENTS

| | | |
|---|---|---|
| JP | 4-204817 | 7/1992 |
| JP | 08-262467 | 10/1996 |
| JP | 9-54333 | 2/1997 |
| JP | 10-246894 | 9/1998 |
| JP | 11-109309 | 4/1999 |
| JP | 11-119245 | 4/1999 |
| JP | 2000-19552 | 1/2000 |
| JP | 2000-81635 | 3/2000 |
| JP | 2000-137445 | 5/2000 |
| JP | 2000-221904 | 8/2000 |
| JP | 2000-260798 | 9/2000 |
| JP | 2002-347206 | 12/2000 |
| JP | 2001-42282 | 2/2001 |
| JP | 2003-068795 | 3/2003 |
| KR | 1999-66068 | 8/1999 |
| KR | 242741 | 2/2000 |

* cited by examiner

DISPLAY DEVICE

BACKGROUND OF THE INVENTION

1. Field of the Invention

The present invention relates to a display device, and more particularly to a COG packaging type liquid crystal display comprising an IC chip for driving a thin film transistor (TFT) on a glass substrate.

2. Description of the Related Art

The liquid crystal display device is comprised of a liquid crystal display panel which is further comprised of two substrates between which the liquid crystal layer is held, and a surface light source unit which is installed on the rear face side of the liquid crystal display panel. The liquid crystal display panel is normally constructed by two insulation transparent substrates made of glass, which face each other, where display material, such as liquid crystals, is sandwiched, so that voltage is applied selectively to this display material. One of the substrates is a thin film transistor array substrate (hereafter called TFT array substrate) where switching elements, such as thin film transistors (TFT) and pixel electrodes connecting these switching elements are formed in a matrix. The other substrate is a color filter substrate (CF substrate) which further comprises R, G and B color layers provided corresponding to the pixel electrodes, and a black matrix (BM) provided between these color layers.

In the TFT array substrate, source lines and gate lines are crossed via an insulation film to apply signals to the switching elements. A plurality of source lines and gate lines are disposed respectively, corresponding to the number of pixel electrodes. A COG type liquid crystal device, where the IC chip for driving the pixel electrodes is directly mounted on the substrate, is known (e.g. Japanese Unexamined Patent Application Publication No. 2000-347206, 2000-81635 and 2001-42282). This IC chip for driving is mounted at the end portion of the glass substrate, outside the display area of the substrate, via the anisotropic conductive film (ACF). And FPC is connected to the end portion of the glass substrate, and power and signals are supplied to the IC for driving via the lines provided on the glass substrate.

The bump configuration of the COG packaging type IC for driving will be described with reference to FIG. 14. FIG. 14 is a top view depicting the configuration around the source driver IC, which is an IC for driving. The driver IC 101 is provided near the end portion of the glass substrate 27. At the longer side of the driver IC 101, a bump for output 16 is provided, and at the other longer side bumps for input are provided. The bump for output 16 is provided at the display area 34 side on the glass substrate, and the bumps for input are provided at the end portion of the substrate. The bumps for input are GND 1, bump for analog power supply 2, bump for digital power supply 3, bump for reference voltage at the positive polarity side 4 and bump for reference voltage at the negative polarity side 5. A plurality of the driver ICs 101 are disposed on the glass substrate, outside the display area, and FPCs (Flexible Printed Circuit) 21 are connected to the end portion of the substrate corresponding to the respective driver IC 101. On the side of the driver IC 101, cascade line is formed, by which a plurality of driver ICs are sequentially connected. This configuration, however, has the following problems.

Because of the dispersion of the ACF connections between the bumps for input of the driver IC 101 and the lines on the glass substrate, the resistance value tends to increase. Also many bumps for connection must be provided on the driver IC, so the bump configuration is restricted and the pitch between bumps cannot be freely increased. Therefore the pitch of the signals of the FPC 21 becomes large with respect to the pitch of the bumps for input of the driver IC 101, lines from the FPC 21 to the driver IC 101 become thin, and the line resistance value increases. By such an increase in the resistance between bumps and the FPC, the driver IC 101 may not operate normally or the desired voltage may not be output. And the operation of the driver IC may have problems, which decreases the display quality. Also in the case of a COG packaging type, the screen border size increases.

In this way, in the case of a conventional COG packaging type liquid crystal display device, the screen border size becomes big and the display quality drops if FPC to the driver IC is wired on the glass substrate.

SUMMARY OF THE INVENTION

With the foregoing in view, it is an object of the present invention to provide a display device which can decrease the screen border size and has excellent display quality.

To these ends, according to one aspect of the present invention, there is provided a display device, including a display panel having an insulation substrate; a drive circuit disposed around a display area on the insulation substrate to output signals to the display panel; a plurality of bumps formed on the drive circuit; and a plurality of lines formed on the insulation substrate and connected with the bumps, wherein adjacent two or more of the plurality of bumps are electrically connected on the drive circuit, and the electrically connected two or more bumps are connected with one of the lines via an anisotropic conductive film. This can reduce the connection resistance between lines and bumps.

In the above display device, it is preferred that the drive circuit is disposed along an edge of the insulation substrate, and the electrically connected bumps are formed substantially in parallel with the edge. This can increase the width of the input line on a glass substrate, thereby reducing line resistance.

In the above display device, the drive circuit may be disposed along an edge of the insulation substrate, and the electrically connected bumps may be formed substantially perpendicular to the edge. This can reduce the connection resistance without increasing a drive circuit size.

According to one aspect of the present invention, there is provided a display device, including a display panel having an insulation substrate; a plurality of drive circuits disposed with a space at an end portion of the insulation substrate along an edge of the insulation substrate to output signals to the display panel; a line section placed at the end portion of the insulation substrate, between the plurality of drive circuits, having external lines for supplying signals or power to the plurality of drive circuits; and a plurality of input lines formed on the insulation substrate and connected with corresponding lines of the plurality of external lines. This can reduce the screen border area.

In the above display device, the external line corresponding to the input line for a highest current flow of the plurality of input lines is preferably placed at a side of the line section closest to the source driver IC where it is connected. This can reduce an output error.

In another aspect of the above display device, the drive circuit may have a plurality of bumps for input formed at an edge side of the insulation substrate along the edge and connected with a line corresponding to the plurality of input lines, and a bump for input corresponding to an input line for a highest current flow of the plurality of input lines may be placed at an outermost side of the drive circuit. This can prevent a decrease in display quality due to long line.

In the above display device, it is preferred that the bumps for input include a bump for GND, a bump for power supply and a bump for reference voltage, the bump for GND and the bump for power supply are placed as one block at a side section and a center of the drive circuit, and the bump for reference voltage is disposed between blocks. This can reduce manufacturing costs.

In the above display device, the bump for GND and the bump for power supply may be electrically connected with the bump for GND and the bump for power supply in a different block, respectively, in the drive circuit. This can reduce the number of lines.

In the above display device, the bump for GND or the bump for power supply in one block may be electrically connected two rows of bumps. This can reduce the connection resistance.

In the above display device, the line section may be disposed at every other space between the drive circuits, and the line section may be connected with the bumps for input of the drive circuits on both sides. This can reduce the number of connection points in the lines.

According to one aspect of the present invention, there is provided a display device, including a display panel having an insulation substrate; a plurality of drive circuits disposed with a space along an edge of the insulation substrate to output signals to the display panel; cascade lines formed on the insulation substrate to connect the drive circuits next to each other; and a plurality of bumps for cascade line formed on the drive circuit along a side to a display area and a side to an adjacent drive circuit and connected with the plurality of cascade lines. This can increase the bump area of the source driver IC.

In the above display device, it is preferred that the cascade lines include a clock signal line and a plurality of image data signal lines, and the clock signal line is disposed between the plurality of image data signal lines. This can reduce a difference in the distance of a clock signal and a plurality of image data signals to reduce image data loading error.

The above display device may further include bumps for output formed along a side of the drive circuit close to a display area to output signals to the display panel, and the bumps for output or bumps for a cascade line may be placed in a staggered fashion. This can increase the area for bumps.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

First Embodiment

Embodiments of the present invention will now be described with reference to the accompany drawings. The following description shows the preferred embodiments of the present invention, however the scope of the present invention is not limited by the following embodiments. In the following description, composing elements denoted with a same reference symbol substantially have the same content.

Figure 1:
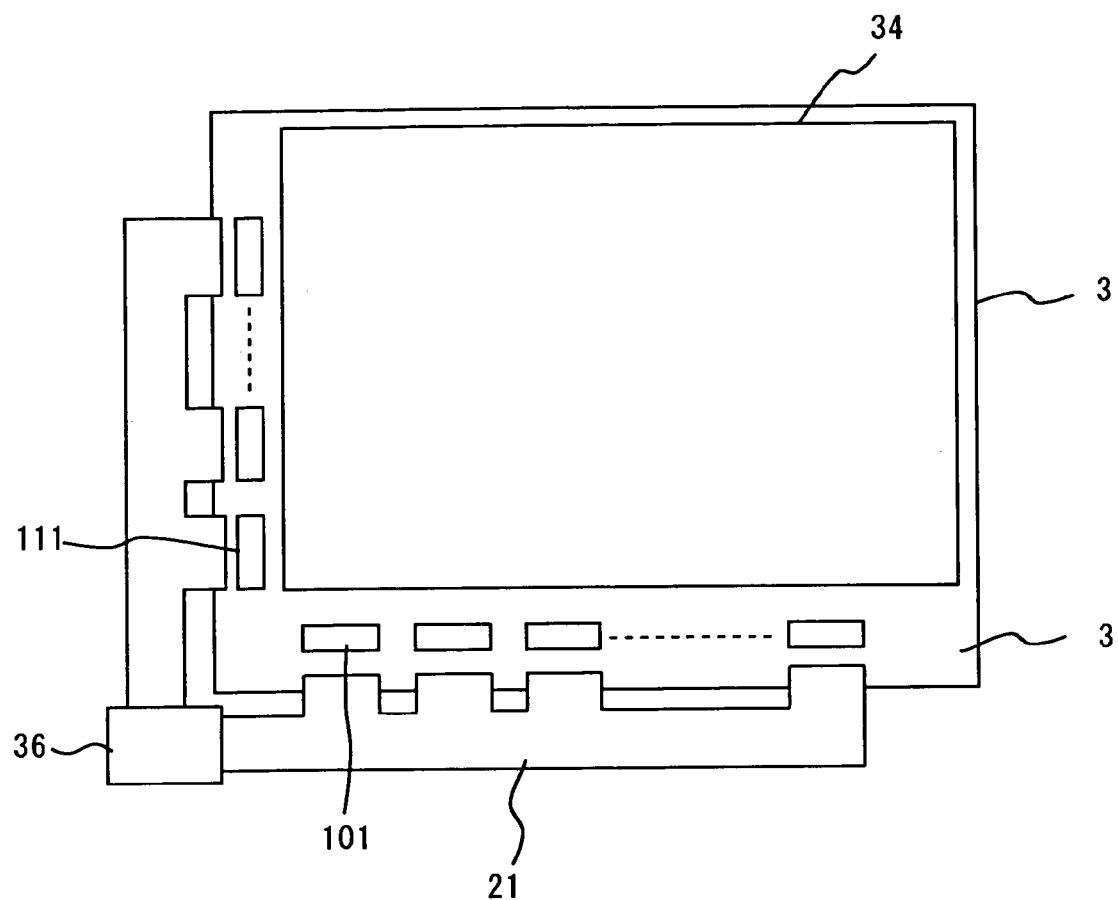
FIG. 1 is a top view depicting a configuration of the liquid crystal display panel.

The configuration of the liquid crystal display panel 33 of the liquid crystal display device will now be described with reference to FIG. 1. FIG. 1 is a top view depicting the configuration of the liquid crystal display panel in the COG packaging type liquid crystal display device. The liquid crystal display panel 33 shown in FIG. 1 is comprised of a display area 34 which is further comprised of a plurality of pixels arrayed in a matrix, and a screen border area 35 outside of the display area 34. The liquid crystal display panel 33 is comprised of an array substrate where an array circuit is formed and the counter substrate thereof, and the liquid crystals are sealed between these two substrates. The active matrix type liquid crystal display panel has switching elements for each pixel to control the input/output of display signals. A typical switching element is a TFT (Thin Film Transistor).

The color liquid crystal display device has an RGB color filter layer on the counter substrate. Each pixel of the display area of the liquid crystal display panel 33 displays one of the colors R, G and B. Of course in a monochrome display, each pixel displays either black or white. In the display area in the array substrate, a plurality of source lines and gate lines are disposed in a matrix. The source lines and the gate lines cross roughly to be perpendicular to each other, and a TFT is disposed near the intersection. In the screen border area 35 of the liquid crystal display panel, a plurality of rectangular source driver ICs 101 are provided in a row along one side of the substrate. At the end portion of the substrate of the side perpendicular to the side where the source driver IC 101 is provided, a plurality of gate drivers 111 are provided in a row in the same way. The row where the source driver ICs 101 are provided and the row where the gate driver ICs 111 are provided are perpendicular to each other. One side of the substrate where the source driver ICs 101 are provided is regarded as the edge of the substrate.

On the rear face side of this liquid crystal display panel 33, a surface light source device comprising a light source, light guiding plate and optical sheet is disposed. The liquid crystal panel 33 has a liquid crystal layer which is sandwiched by the TFT array substrate and the CF substrate. On the display area 34 of the TFT array substrate, switching elements for driving the liquid crystal layer are formed in a matrix. Also a plurality of gate lines and a plurality of source lines are provided to be perpendicular to each other for supplying signals to the switching elements. The source driver ICs 101 and the gate driver ICs 111 are installed on the glass substrate via the anisotropic conductive film ACF.

On the bottom face of each driver IC, bumps for input are formed to connect with the terminal of the lines formed on the glass substrate. These bumps for input and the terminals of the lines are electrically connected via the anisotropic conductive film. From the control circuit section 36, image data signals, clock signals and power supply for driving ICs are supplied to the gate driver IC 111 and the source driver IC 101 via the FCP and the lines on the glass substrate. Signals from each driver IC are supplied to the gate lines and the source lines to drive the switching elements, and voltage is supplied to the pixel electrodes to drive the liquid crystal layer and display a desired image.

The configuration of the source driver IC of the liquid crystal display device according to the present embodiment will now be described with reference to FIG. 2 to FIG. 9. 1 is a bump for GND, 2 is a bump for the analog power supply, 3 is a bump for the digital power supply, 4 is a bump for the reference voltage at the positive polarity side, 5 is a bump for the reference voltage at the negative polarity side, 6 is a bump for the analog power supply, 7 is a bump for GND, 8 is a bump for the digital power supply, 9 is a bump for the reference voltage at the positive polarity side, 10 is a bump for the reference voltage at the negative polarity side, 11 is a bump for the digital power supply, 12 is a bump for the analog power supply, 13 is a bump for GND, 14 is a bump for the digital signal, 15 is a bump for the digital signal, and 16 is a bump for the output. These are provided on the source driver IC 101. 17 is a control signal line, 18 is an image data signal line, 19 is an image data signal line and 20 is a clock signal line. These are logic signals which are cascade-connected between the source driver IC 101a and the adjacent source driver IC 101b. 22 is a reference voltage at the positive polarity side, 23 is an analog voltage, 24 is GND, 25 is a digital power supply and 26 is a reference voltage at the negative reference side. These are lines between the FPC 21 and the source driver IC 101. 60 is cascade lines and 61 is lines for input, and these are formed by patterning a metal film, a transparent conductive film such as ITO, on the glass substrate.

Figure 2:
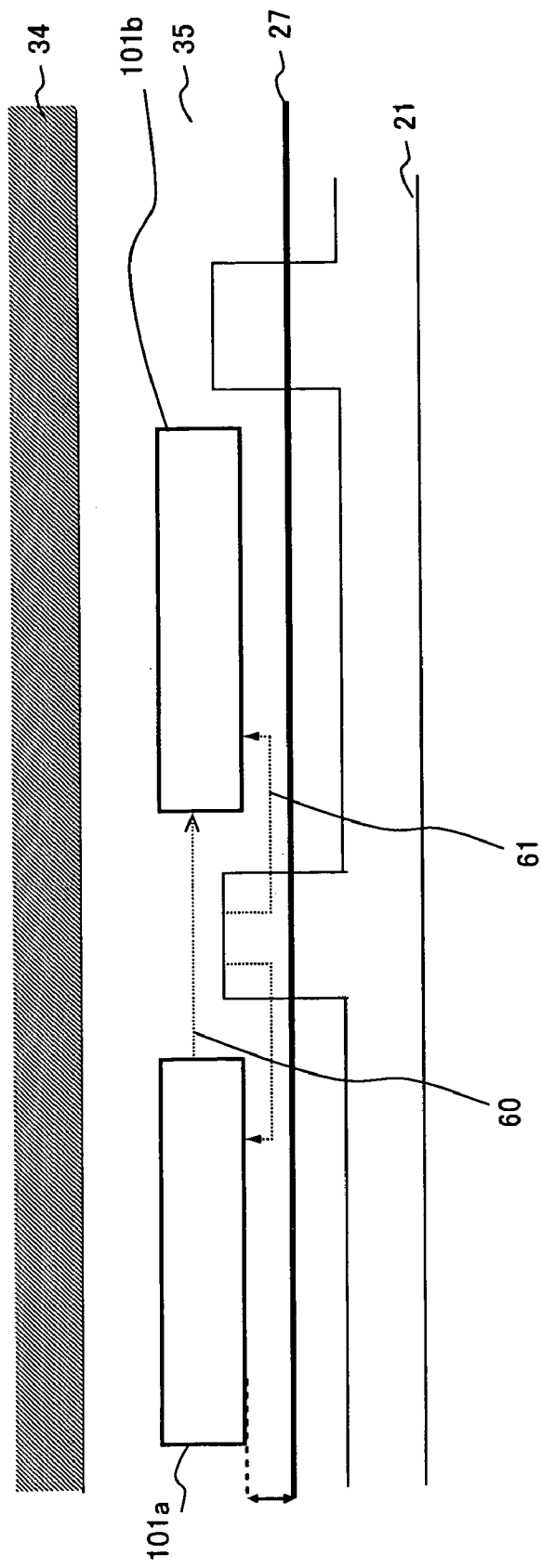
FIG. 2 is a plan view depicting a configuration of the end portion of the liquid crystal display panel of the liquid crystal display device according to the first embodiment of the present invention.

FIG. 2 is a plan view depicting the configuration of the end portion of the substrate where the source driver IC 101 of the liquid crystal panel 33 is provided. As FIG. 2 shows, the source driver ICs 101 according to the present embodiment are provided on the screen border area 35 along the edge of the substrate. Here it is assumed that the screen border area where the source driver ICs 101 are provided is called the end portion of the substrate. The long side 102 of the rectangular source driver IC 101a is in parallel with the substrate edge. The long side 103 at the opposite side is roughly in parallel with the display area 34. It is assumed that the long side 102 is the long side 102 at the substrate end side, and the long side 103 is the long side 103 at the display area side. At the short side 104 side of the source driver IC 101a, the source driver IC 101b is provided with a space. These source drivers ICs 101 are continuously disposed in a row with a space along one side of the substrate. The cascade line for logic signals 60 for cascade connection is formed in the space between the source driver ICs on the glass substrate, and each source driver IC 101 is cascade-connected. Between the adjacent source driver IC 101a and the source driver IC 101b, the FPC 21, for supplying signals and power from the external control circuit section 36, is installed from the substrate end side. By this, the screen border area can be narrower. On the FPC 21, GND line, line for the digital power supply, line for the analog power supply, line for the reference voltage at the positive polarity side, and line for the reference voltage at the negative polarity side, a total of five types are formed for driving the source driver ICs 101. These five types of lines on the FPC are connected to the corresponding lines of the lines for input 61 respectively. The signals and the power from the FPC 21 are supplied to the source driver IC 101 via the lines for input 61 formed on the glass substrate. For the lines for input 61 and the cascade lines 60, a plurality of lines are formed on the glass substrate respectively.

In order to decrease the influence of line resistance of the cascade line 60 and in the line for input 61 on the glass substrate on display quality deterioration, it is preferable to make the line length shorter and the line width thicker. On the bottom face of the source driver IC 101 at the substrate end side, bumps for input for inputting signals and power from FPC are provided. At the display area side of the source driver IC 101, a bump for output for outputting signals to the source line is formed. These bumps for input are connected to the corresponding terminals of the line for input 61 on the glass substrate via the ACF. The bumps for output are connected with the corresponding source lines provided in the display area. When the FPC 21 is connected between the source driver ICs as mentioned above, the line resistance must be decreased by increasing the line width on the glass substrate, since the line length becomes longer. This configuration will be described with reference to FIG. 3.

Figure 3:
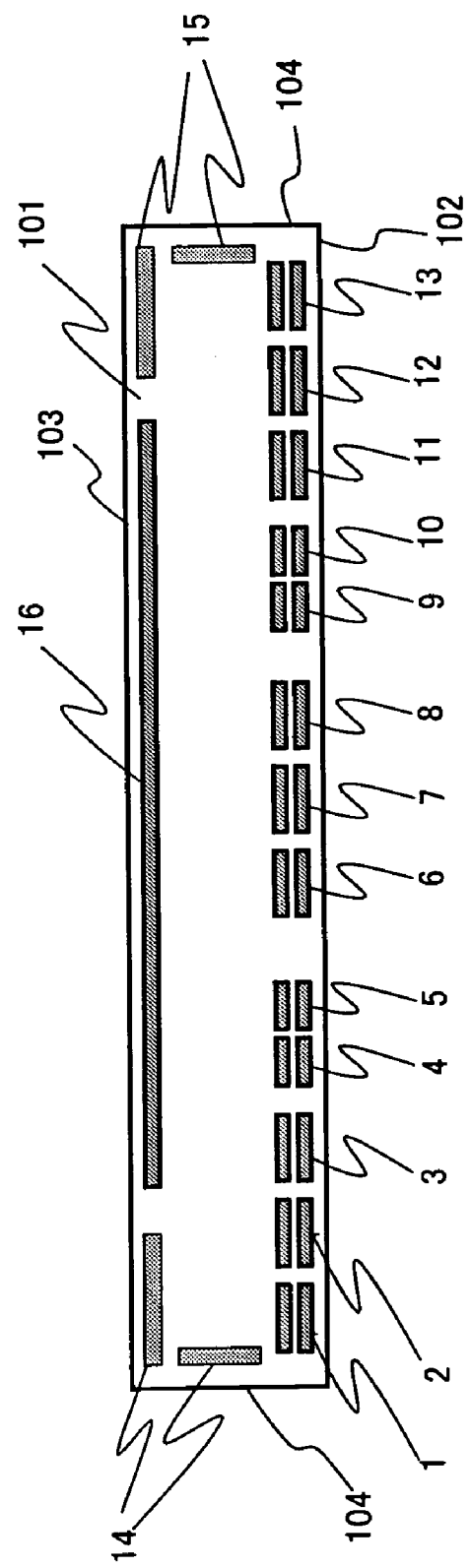
FIG. 3 is a plan view depicting a configuration of the source driver IC of the liquid crystal display device according to the first embodiment of the present invention.

At first, the bump array of the source driver IC 101 will be described. FIG. 3 is a plan view depicting the bump array of the source driver IC of the liquid crystal display device according to the present embodiment. As FIG. 3 shows, the bumps for GND 1, 7 and 13, the bumps for analog power supply 2, 6 and 12, the bumps for digital power supply 3, 8 and 11, the bumps for reference voltage at the positive polarity side 4 and 9, and the bumps for reference voltage at the negative polarity side 5 and 10 are provided in two rows along the long side 102 at the substrate end side of the source driver IC 101. By these bumps for input, signals from the FPC are input. The bump for GND 1, the bump for GND 7 and the bump for GND 13 are electrically connected inside the source driver IC. In the same way, the bump for analog power supply 2, the bump for analog power supply 6, the bump for analog power supply 12, the bump for digital power supply 3, the bump for digital power supply 8 and the bump for digital power supply 11 are also electrically connected inside the source driver IC. Low resistance line is used for these connections. The bump for GND 1, the bump for analog power supply 2, and the bump for digital power supply 3 form one block, and this block is provided at the left side of the source driver IC 101. In the same way, the bump for GND 7, the bump for analog power supply 6, and the bump for digital power supply 8 form one block, and this block is provided at the center of the source driver IC 101. Also the bump for GND 13, the bump for analog power supply 12, and the bump for digital power supply 11 form one block, and this block is provided at the right of the source driver IC 101. And between each block, the bump for reference voltage at the positive polarity side 4 and the bump for reference voltage at the negative polarity side 5, or the bump for reference voltage at the positive polarity side 9 and the bump for reference voltage at the negative polarity side 10 are provided. In this way, five types of bumps for input are formed in one source driver IC 101.

The bump for digital signal 14 and the bump for digital signal 15 are provided around the corner of the display area side of the source driver IC 101. The bumps for digital signals 14 and 15 are bumps for cascade connection, which have bi-directional functions. In other words, when the digital signal is input to the bump for digital signal 15, the bump for digital signal 14 outputs the output signal to the next source driver IC. Whereas when the digital signal is input to the bump for digital signal 14, the bump for digital signal 15 outputs the output signal to the next source driver IC. Here the digital signal is input to the bump for digital signal 14, and is output from the bump for digital signal 15. This connection is continuously made between adjacent source driver ICs to form a cascade connection. Therefore the bump for digital signal 14 becomes upstream, and the bump for digital signal 15 becomes downstream. A plurality of bumps for digital signals 14 and 15 are provided along the long side 103 at the display area side and along the short side 104 of the adjacent drive circuit side respectively.

At the long side 103 side of the display area of the source driver IC 101, bumps for output 16 are provided. A plurality of bumps for output 16 are provided along the long side 103 between the bumps for digital signal 14 and the bumps for digital signal 15. The bumps for output 16 are connected to the respective source line, and outputs the pixel voltage in the TFT of the liquid crystal display panel 33. In FIG. 3, the number of bumps for reference voltage at the positive polarity side 4 and 9, and the bumps for reference voltage at the negative polarity side 5 and 10 is one each, but actually the number of bumps at the positive polarity side and the negative polarity side is m/2 respectively, since m/2 out of m (m is 2 or higher integer) of the voltage lines, which are input from the outside which determines the reference of the source driver IC 101, are the voltage lines at the positive polarity side, and the other m/2 are the voltage lines at the negative polarity side. The number of lines thereof is of course m/2. Also m/2 number of bumps for input are provided at the substrate end side and the inside thereof in two rows. For the bumps for output 16, bumps for digital signal 15 and bumps for digital signal 14 as well, a plurality of bumps are provided corresponding to the number of source lines. The source driver IC 101 is driven by the power supply voltage, which is input from the bump for digital power supply and the bump for analog power supply, and outputs the image display signals to the liquid crystal display panel based on such digital signals as clock signals, image data and control signals, and reference voltage.

Figure 4:
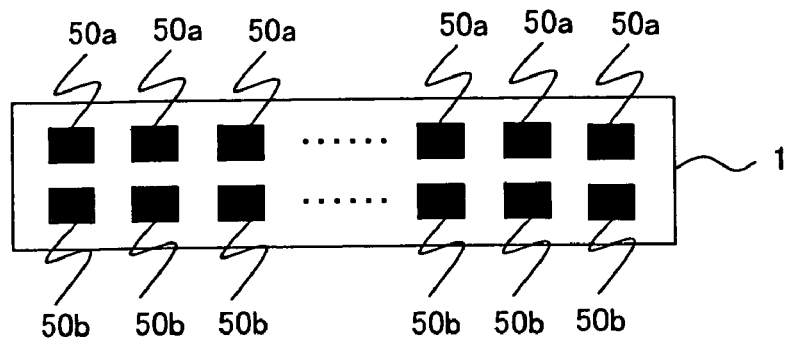
FIG. 4 is a plan view depicting a configuration of the bumps for GND provided on the source driver IC of the liquid crystal display device according to the first embodiment of the present invention.

The configuration of these bumps will now be described with reference to FIG. 4. FIG. 4 is a plan view depicting the configuration of the bump for GND 1. The bump for GND 1 is comprised of many bumps, 50a and 50b. The bump for GND 1 is comprised of two rows of bumps, that is a row of bumps 50b, at the substrate end side, and a row of bumps 50a, provided inside the bumps 50b, and each row is in parallel with the long side 102 of the source driver IC 101. Therefore the row of bumps 50a at the display area side and the row of bumps 50b at the substrate end side are in parallel with the substrate edge. At the respective portion of the bumps 50a and 50b, conductive material, such as gold, is exposed, surrounded by an insulation material. For forming these bumps, a normal manufacturing method is used, such as patterning the conductive material, then coating the insulation material, and exposing and developing this to provide holes, and then plating. All the bumps 50a and 50b are connected with a low resistance conductive material, and all the bumps 50a and 50b are at a same potential. The bumps 50a and 50b are formed on the source driver IC 101, and are connected with the lines on the glass substrate via an anisotropic conductive film (ACF).

Since the line width and the line length on the glass influence the line resistance, it is preferable to make the line width as wide as possible. In particular when the line is made of a transparent conductive film, such as ITO, of which the electric characteristics are not as good as metal, the deterioration of line resistance appears more clearly. By forming many bumps 50b along the substrate end, as shown in the present embodiment, the line width can be widened up to the length of the row of the bumps 50b. If the exposed area of the conductive material of the bumps 50a and 50b is increased, the uniformity of the exposed faces deteriorates, and the surface of the exposed faces become uneven, this due to manufacturing reasons. This makes the connection resistance between the ACF and the bump higher. The ACF is normally constituted by mixing conductive materials in resin film. Even if the distribution of the particles in the ACF disperses, the deterioration of the connection resistance can be prevented by providing many bumps with a same potential and connecting them with the ACF. If the number of contact points with the ACF is increased by providing a plurality of bumps to be connected with one line, a decrease in the connection resistance can be prevented, since even if certain bumps have connection problems, other bumps can be in connection. By connecting two or more adjacent bumps at a same potential with one line inside the source driver IC 101, the resistance value can be decreased, and the generation of display defects caused by the resistance deterioration can be prevented.

The other bumps for GND 7 and 13, are also comprised of a plurality of bumps respectively in the same way. The bumps for analog power supply 2, 6 and 12 and the bumps for digital power supply 3, 8 and 11 are also comprised of a plurality of bumps respectively in the same way, so a similar effect can be obtained. Certainly the respective number of bumps to be connected to one line may be a different number, and the length of the row of the bumps can be adjusted corresponding to the width of the line.

Figure 5:
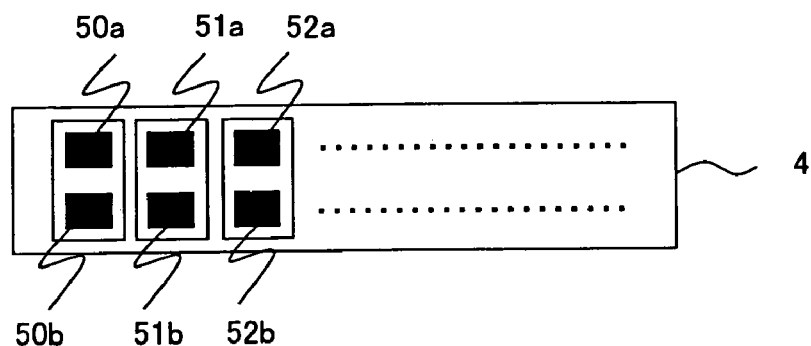
FIG. 5 is a plan view depicting a configuration of the bumps for reference voltage provided on the source driver IC of the liquid crystal display device according to the first embodiment of the present invention.

Now the configuration of the bump for reference voltage at the positive polarity side 4 will be described with reference to FIG. 5. In the reference voltage line, less current flows compared with the power supply and GND line, so display quality is less influenced, even if the number of bumps for reference voltage is less than the number of bumps of the bumps for GND, the bumps for analog power supply and the bumps for digital power supply. Therefore in the present embodiment, the bumps for reference voltage 4 are comprised of two rows, where two bumps are electrically connected. As FIG. 5 shows, the bumps 50b are provided at the substrate end side, and the bumps 50a are provided along with the bumps 50b, at the inner side of the substrate (display area side). The adjacent bumps 50a and 50b are electrically connected. These bumps 50a and 50b constitute a set of bumps, and are connected to one of the reference voltage lines at the positive polarity side. Next to these bumps 50a and 50b, the bumps 51a and 51b are provided, which are also electrically connected. These adjacent bumps 51a and 51b constitute a set of bumps, in the same way, and are connected to a different reference voltage line. This is the same for the bumps 52a and 52b. The bumps 50a, 51a and 52a are formed in a row along the substrate end. In the same way, the bumps 50b, 51b and 52b are also formed in a row along the substrate end. In this way, among the bumps arrayed in two rows, two bumps, as a set, are connected with the respective reference voltage line. Therefore the bumps 50a, 51a and 52b are insulated respectively.

The bumps 50a and 50b are formed on the source drive IC 101, and are connected to one line for the positive reference voltage provided on the glass substrate via an anisotropic conductive film (ACF). Since bumps are provided for the bumps for reference voltage at the positive polarity side 4 in an actual source driver IC 101, corresponding to the positive reference voltage lines, the number of bumps in a row is m/2, and two rows are formed along the substrate end. In other words, m/2 sets of bumps are provided corresponding to the positive reference voltage lines, and two rows of these are formed, so a total of m bumps are provided. And two bumps at a same potential are provided in a direction perpendicular to the substrate end. By providing the plurality of bumps in a vertical direction, the number of bumps to be connected with one line can be increased without increasing the external size of the source driver IC 101. Therefore the connection resistance can be decreased.

Just like the bumps for reference voltage at the positive polarity side 4, for the bumps for reference voltage at the negative polarity side 5, bumps for reference voltage at the positive polarity side 9, and bumps for reference voltage at the negative polarity side 10 as well, m/2 number of bumps are provided for one row, and two rows of these bumps are provided to be perpendicular to the substrate end. And two bumps at the substrate end side and inner side thereto, as one set, are connected with the input terminal of one line on the glass substrate. By this a similar effect can be obtained. Needless to say, not only the source driver IC 101 but also the bumps of the gate driver IC 111, the bumps for output, and the bumps for digital signals may be formed as the configuration shown in FIG. 4 and FIG. 5 to obtain a similar effect.

Figure 6:
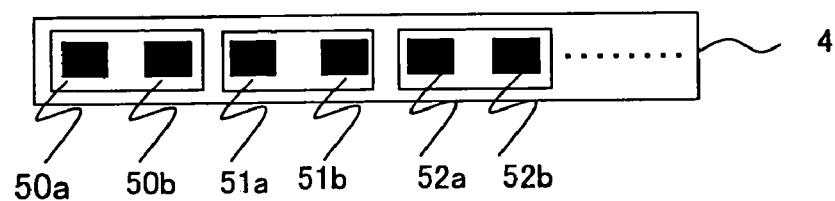
FIG. 6 is a plan view depicting another configuration of the bumps for reference voltage provided on the source driver IC of the liquid crystal display device according to the first embodiment of the present invention.

In FIG. 5, two bumps are provided vertically, but if it is necessary to reduce the line resistance value, then two bumps with a same potential may be provided in a horizontal direction (in a parallel direction with the substrate edge), as shown in FIG. 6. In this case, the m number of bumps are formed in one row along the substrate end. And two adjacent bumps (e.g. bumps 50a and 50b) are electrically connected as one set, and m/2 sets of bumps with a same potential are formed. A set of bumps with a same potential are connected with the respective reference voltage on the glass substrate via the ACF. With this configuration as well, the effect of providing a plurality of bumps can be acquired. Also if a set of bumps is constituted along the substrate end, as shown in FIG. 6, line on the glass substrate can be thicker. This makes it possible to reduce the line resistance value and to improve the display quality.

Figure 7:
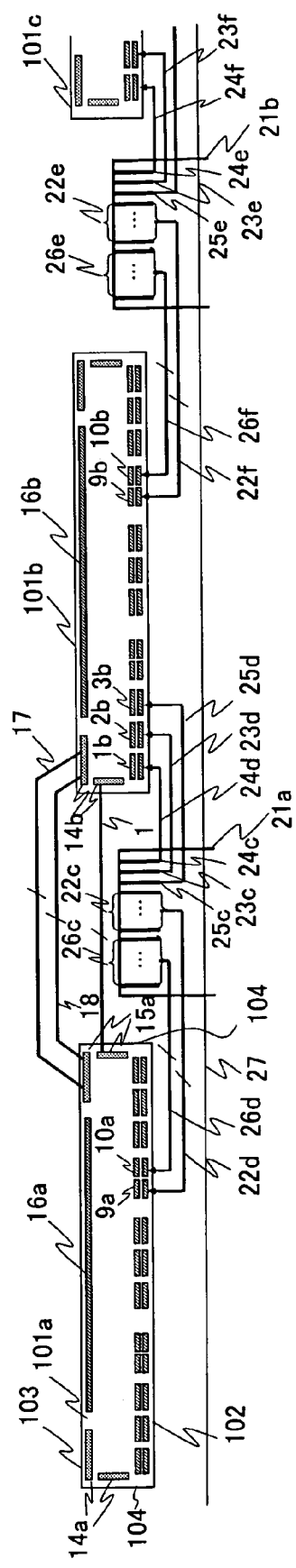
FIG. 7 is a plan view depicting a configuration of an area around the bumps for input provided on the source driver IC of the liquid crystal display device according to the first embodiment of the present invention.

Now the configuration where the FPC 21 is connected to the substrate end of the glass substrate 27, on which the above mentioned source driver IC 101 is mounted, will be described with reference to FIG. 7. FIG. 7 is a plan view depicting the configuration of the source driver IC 101 and the FPC 21 on the glass substrate. The FPC 21 is connected between the source driver IC 101a and the adjacent source driver IC 101b. The FPC 21 is connected from the substrate edge between the source driver ICs, and is disposed at the substrate end side from the long side 103 of the source driver IC 101 at the display area side. For packaging purposes, the FPC 21 and the glass substrate must be connected at a distance that is a predetermined length or more, so narrowing the screen border of the substrate is limited. By disposing the FPC 21 between the source driver ICs 101 as shown in the present embodiment, the FPC can be formed more to the inner side of the glass substrate 27 than the case of disposing the source driver IC 101 and the FPC facing each other, and disposing the FPC to the outer side from the long side of the substrate end of the source driver IC 101, which can make the screen border narrower.

The source driver IC 101 has a similar configuration as that shown in FIG. 3. Now the configuration and the connection between the source driver ICs 101a and 101b and the FPC 21a will be described. The FPC provided between the source driver IC 101a and the adjacent source driver IC 101b is regarded as FPC 21a, and the FPC 21 provided between the source driver IC 101b and the adjacent source driver IC 101c is regarded as FPC 21b. FPC 21a and 21b and the source driver ICs 101a, 101b and 101c have the same configuration respectively, and are connected in the same way, so description is omitted for the configuration around the FPC 21b. This source driver IC 101 and the FPC 21 are mounted repeatedly along the substrate end. In the FPC 21, a plurality of external lines for supplying power supply and signals from the control circuit section 36 are provided. These external lines are for GND, analog power supply, digital power supply, reference voltage at the positive polarity side, and reference voltage at the negative polarity side. Near the tip of the FPC 21, the terminal for GND 24c, the terminal for analog power supply 23c, the terminal for reference voltage at the positive polarity side 22c, the terminal for reference voltage at the negative polarity side 26c and the terminal for digital power supply 25c are provided for connecting the lines on the FPC and the lines for input on the glass substrate. On the glass substrate, lines for GND 24d, analog power supply 23d, digital power supply 25d, reference voltage at the positive polarity side 22d, and reference voltage at the negative polarity side 26d, which are lines for input from the terminal to the bumps for input, are provided in parallel with the substrate edge. These lines for input are connected with the corresponding bumps for input respectively, crossing the side section of the FPC (side perpendicular to the substrate edge). For example, the terminal for analog power supply 23c is connected with the bump for analog power supply 22b provided on the source driver IC 101b via the analog power supply 23d on the glass substrate. The input lines for the GND 24d, digital power supply 25d, reference voltage at the positive polarity side 22d, and reference voltage at the negative polarity side 26d as well are connected in the same way.

In the present embodiment, the terminal for digital power supply 25c, the terminal for analog power supply 23c and the terminal for GND 24c of the FPC 21a are connected to the bump for digital power supply 3b, the bump for analog power supply 2b, and the bump for GND 1b in the block at the left of the source driver IC 101b provided at the right of the FPC 21a respectively. The terminal for reference voltage at the positive polarity side 22c and the terminal for reference voltage at the negative polarity side 26c of the FPC 21a, on the other hand, are connected to the bump for reference voltage at the positive polarity side 9a and the terminal for reference voltage at the negative polarity side 10a of the source driver IC 101a provided at the left of the FPC 21a respectively. In this way, signals or power are supplied to both the source driver IC 101a and the source driver IC 101b from the FPC 21a at one location. By repeating such a configuration, power and signals are supplied to all the source driver ICs 101 formed at the end portion of the substrate.

When the FPC 21 is disposed between the source driver ICs, the lines on the glass substrate are formed in parallel with the substrate end. Therefore the thickness and the number of lines provided outside the source driver IC 101 must be restricted in order to decrease the screen border area. By connecting the lines from the FPC 21a at one location with the bumps for input of the source driver IC 101a and the source driver IC 101b at the right and left to supply signals and power, as the present embodiment shows, the width of the space where lines can be formed can be increased without widening the screen border area. As a result, the lines can be thicker even if the FPC is connected between the source driver ICs, and a drop of the display quality due to the deterioration of the line resistance can be suppressed.

Normally the current that flows to the line of GND, the lines of digital power supply and the analog power supply of the power supply system is larger than the current which flows through the lines of the reference voltage, which is a signal system. In order to suppress a drop of display quality due to the deterioration of the line resistance, it is preferable to make the lines of the GND 24d, the digital power supply 25d and the analog power supply 23d to be thick or short. For the line for the reference voltage, on the other hand, where the current flow is small, the line may be thinner than those of the GND and the power supply system, because the influence on the display quality is small. In order to make the lines of the GND and the power supply system thick, the lines for GND, digital power supply and analog power supply are connected with the source driver IC 101b at the right, and the lines for reference voltage, where there are many lines by where the influence is small even if the line is thin, is connected with the bumps for reference voltage 9a and 10a of the source driver IC 101a at the left. By connecting many lines of the reference voltage and the lines of the GND, the analog power supply and the digital power supply are connected separately to the source driver ICs 101 at the left and right, so in this way the lines of the GND, analog power supply and digital power supply on the glass substrate can be thicker, and the drop of display quality due to the deterioration of the line resistance can be prevented.

The current that flows through lines is normally highest for the GND, then the analog power supply and finally the digital power supply, where the total current that flows through the lines for the analog power supply and the digital power supply is roughly the same as the current that flows through the line for the GND. In the present embodiment, the terminal for GND 24c, the terminal for analog power supply 23c and the terminal for digital power supply 25c are provided in this sequence from the outer side, at the right of the FPC 21a. In the source driver IC 101b, on the other hand, the bump for GND 1a, the bump for analog power supply 2a and the bump for digital power supply 3a are provided in this sequence from the outer side, at the left of the long side 102 at the substrate end side. By this configuration, the line length on the glass substrate can be shorter and the line resistance value can be smaller as the current which flows increases so that a voltage drop can be suppressed. As a result, output errors of the source driver IC can be eliminated.

Also the size of the bumps for input can be changed according to the thickness of the line. In other words, the number of bumps 50a is adjusted for the line for the GND, where the highest current flows, so that the length of the row of the bumps 50a shown in FIG. 4 becomes longer. For the line for the analog power supply, where the second highest current flows, the number of bumps is decreased so that the row thereof becomes shorter than the row of the bumps for GND. For the line for the digital power supply, where the third highest current flows, the number of bumps is further decreased. In this way, by adjusting the number of bumps to increase the thickness of the lines according to current flow, and by increasing the size of the bumps according to the thickness, line resistance can be decreased without increasing the packaging space. Also the connection resistance can be decreased by increasing the number of bumps for input to be connected with one line. By this, a liquid crystal display device which excels in display quality and has a narrow screen border area can be provided.

The logic signal lines 17, 18 and 19, which are cascade-connected between the source driver IC 101a and the source driver IC 101b, are provided at the long side at the display area side and at the short side at the source driver IC side. The logic signal lines between the source driver IC 101b and the source driver IC 101c also have a similar configuration, so illustration and description thereof are omitted. The configuration of the above mentioned cascade-connected logic signal lines will now be described with reference to FIG. 8. In the source driver IC 101a according to the present embodiment, a bump for digital signals 15a is formed in an area near the corner at the right at the display area side. A plurality of image data signal lines 18 and 19 and control signal lines 17 are provided respectively corresponding to the number of colors of the liquid crystal display panel. In the same way, the bump for digital signals 14b is formed in an area near the corner at the left at the display area side in the source driver IC 101b. In this bump for digital signals 15a, a plurality of bumps are formed along the long side 103 and short side 104 at the display area side. In the same way, in the bump for digital signals 14b, a plurality of bumps are formed along the long side 103 and short side 104 at the display area side. The plurality of bumps of the bumps for digital signals 15a and the bumps for digital signals 14b are formed symmetrically, and respective bumps correspond to each other by the image data signal lines 18 and 19, control signal line 17 and clock signal line 20.

The source driver IC upstream (e.g. source driver IC 101a) to the source driver IC downstream (e.g. source driver IC 101b) are sequentially cascade-connected by the logic signal lines. The logic signal lines to be cascade-connected used to be formed along the long side 102 at the substrate end side, which restricts the size of the bumps for input. Therefore unless the source driver IC size is increased, the lines to be connected to the bumps become narrow, which deteriorates resistance Also if the FPC 21 is connected between the source driver ICs when the logic signal line is formed along the long side 102 at the substrate end side, the bumps for input become closer to the center of the source driver IC than the bumps for logic signals, which makes the lines to be connected to the bumps for input on the glass substrate longer. If each one of the bumps for digital signals 14 and the bumps for digital signals 15 is formed along two sides, the long side 103 and the short side 104, at the display area side, as in this embodiment, the area for forming the bumps of the source driver IC can be increased, and the line resistance can be decreased. Each one of the bumps for digital signals 14 may be laid out zigzag. This allows an increase in the bump size without increasing the source driver IC size. In the same way, the bumps for digital signals 16 and the bumps for output may be laid out zigzag.

Figure 9:
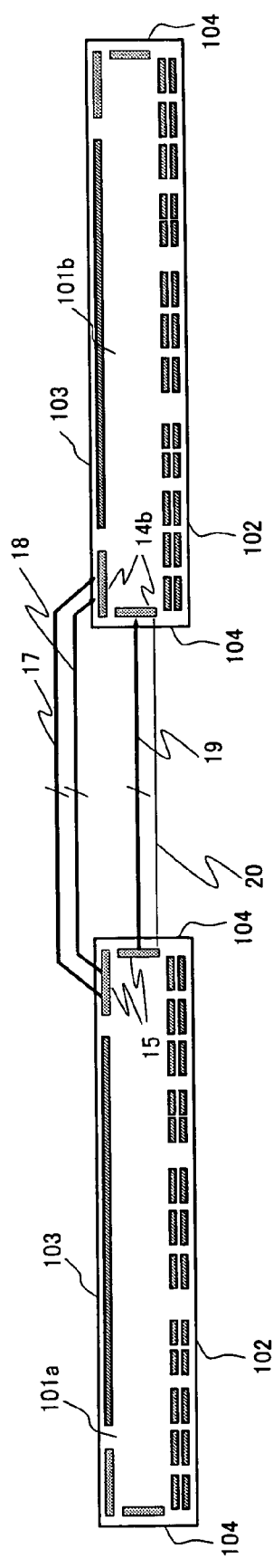
FIG. 9 is a plan view depicting another configuration of an area around the bumps for logic signals provided on the source driver IC of the liquid crystal display device according to the first embodiment of the present invention.

In FIG. 9, the control signal line 17 and the image data signal line 18 are connected to the bumps for logic signals 15a, which are provided at the long side 103 at the display area side of the source driver IC 101a. At the short side 104 side of the source driver IC 101a, the image data signal line 19 and the clock signal line 20 are provided The total number of image data signal lines 18 and 19 is n (n is 2 or higher integer) according to the number of colors. The number of image data signal lines 18 is n/2, and the number of image data signal lines 19 is n/2. In this configuration, however, a difference is generated in the distances between each one of the n number of image data signal lines and the clock signal line. If there is a difference in the distances between each image data signal line and the clock signal line, image data capturing errors may be generated by delays and waveform distortion, due to the line resistance value of the image data signal lines.

Figure 8:
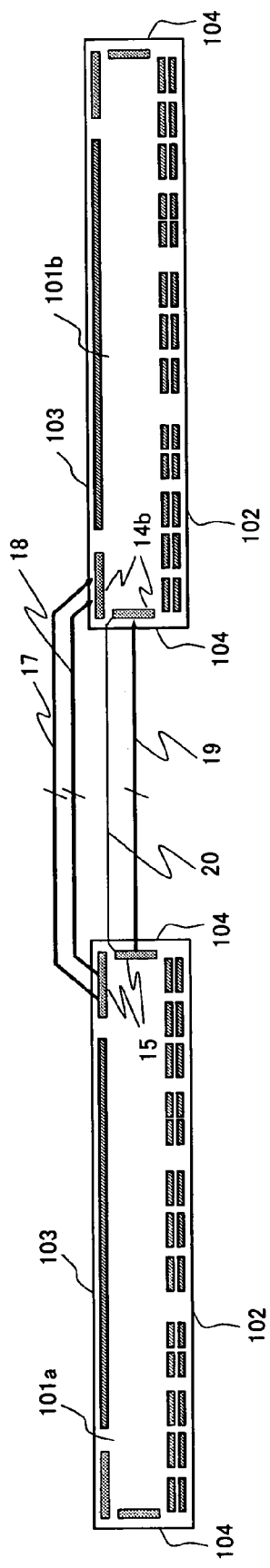
FIG. 8 is a plan view depicting a configuration of an area around the bumps for logic signals provided on the source driver IC of the liquid crystal display device according to the first embodiment of the present invention.

In this case, the difference in the distances between each image data signal line and clock signal line can be decreased by disposing the clock signal line 20 at the center, between n/2 number of image data signal lines 18 and n/2 number of image data signal lines 19, as shown in FIG. 8. In FIG. 8, the bump for digital signals 15a, provided at the long side 103 side (display area side) of the source driver IC 101a, is connected with the bump for digital signals 14b, provided at the long side 103 side (display area side) of the source driver IC 101b via the control signal line 17 and the image data signal line 18. In the same way, the bump for digital signals 15a, provided at the short side 104 side of the source driver IC 101a, is connected with the bump for digital signals 14b, provided at the short side 104 side of the source driver IC 101b via the clock signal line 20 and the image data signal line 19. Here it is assumed that the adjacent source driver IC side of the source driver IC 101 is a side section. And the clock signal line 20 is formed at the center between the image data signal line 19 and the image data signal line 18. By disposing the clock signal line at the center of all the image data signal lines, data capturing errors caused by delays and waveform distortion due to the line resistance value on the glass substrate can be decreased. Also by transmitting the control signals, which speed is low, outside the image data signal line, the difference in glass line resistance values of the clock signal and the image data signal can be decreased, which makes it easier to secure margins for setup and hold time. In this way, a liquid crystal display device with excellent display quality can be provided by disposing the clock signal line 20 between the image data signal line 18 and the image data signal line 19.

Second Embodiment

Figure 10:
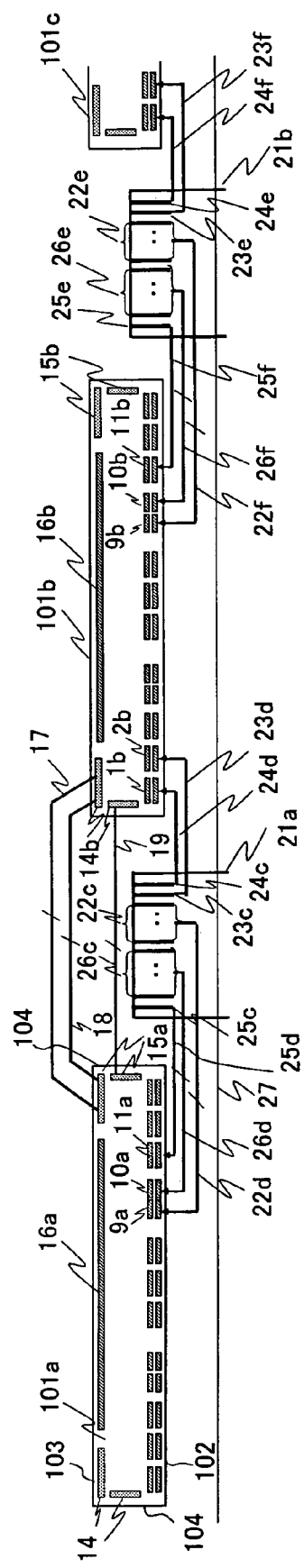
FIG. 10 is a plan view depicting a configuration of an area around the bumps for input provided on the source driver IC of the liquid crystal display device according to the second embodiment of the present invention.

The present embodiment will be described with reference to FIG. 10. FIG. 10 is a plan view depicting the configuration of the area around the bumps for input provided on the source driver IC of the liquid crystal display device. Compared with the first embodiment, the configuration between the FPC 21 and the bumps for input is different in the present embodiment, and description will be omitted for the configuration the same as the first embodiment.

In the present embodiment, in the FPC 21, the terminal for GND 24c and the terminal for analog power supply 23c are connected to the source driver IC 101b at the right, and the terminal for digital power supply 25c, the terminal for reference voltage at the positive polarity side 22c and the terminal for reference voltage at the negative polarity side 26c are connected with the source driver IC 101a at the left. By providing the terminal for digital power supply 25c at the left of the FPC 21, the line width of the GND 24d and the analog power supply 23d can be increased without increasing the screen border area. Normally the total current that flows through the lines for analog power supply 23d and the digital power supply line is roughly the same as the current that flow through the line for the GND 24d, so if the current that flows through the line for digital power supply 25d is extremely smaller than that of the analog power supply 23d, the current that flows through the lines for GND 24d and the analog power supply 23d become dominant among the current that flows through the source driver IC 101. Therefore it is preferable to make the lines for the GND 24d and the analog power supply 23d to be thicker. At the left of the FPC 21, the terminal for digital power supply 25c is provided and is connected with the source driver IC 101a at the left. At the right of the FPC 21a, on the other hand, only the terminal for GND 24c and the terminal for analog power supply 23c are provided and are connected with the source driver IC 101b at the right. By this, lines for input provided in the side section at the right of the FPC 21a are only two types, lines for GND 24d and analog power supply 23d, and compared with the first embodiment, lines of the GND 24d and the analog power supply 23d can be thicker for the amount of the line for the digital power supply 25d.

Also according to the present embodiment, in the right side section of the FPC 21, the terminal for GND 24c is disposed at the furthest outer side, and the terminal for analog power supply 23c is disposed at the inner side thereof. At the substrate end side of the source driver IC 101b, the bump for GND 1b is disposed at the furthest left side, and the bump for analog power supply 2b is disposed next to it. By this, the line for the GND 24d, where current flows the most, can be shorter than that for the analog power supply 23d, which can prevent the deterioration of line resistance. In the side section at the left of the FPC 21 (source driver IC 101a side) as well, the terminal for digital power supply 25c is provided at the furthest outer side among the terminal for digital power supply 25c, terminal for reference voltage at the positive polarity side 22c and terminal for reference voltage at the negative polarity side 26c. At the right side of the source driver IC 101a as well, the bump for digital power supply 11a is provided at the furthest right side among the bump for digital power supply 11a, bump for reference voltage at the positive polarity side 9a and bump for reference voltage at the negative polarity side 10a. By this, the line for digital power supply 25d can be shorter than that for reference voltage. A drop in the display quality, due to the deterioration of line resistance, can be prevented by providing the bumps for input for GND and power supply at the outer side of the bumps for input for reference voltage at the substrate end side of the source drive IC 101.

In this way, by disposing the terminal for GND 24c at the furthest outer side in the side section of the FPC 21 and disposing the bump for GND 1 at the furthest outer side in the side section of the source driver IC 101b, the distance between the terminals and the bumps can be decreased, and the line length on the glass substrate can be decreased. As a result, even if the FPC 21 is disposed between the source driver ICs, a drop of display quality, due to the deterioration of line resistance, and output errors can be prevented. Also by providing the terminal where the most current flows at the outer side in the FPC 21 and is disposed on the source driver IC so as to face the bump for input to be connected with this terminal, the deterioration of display quality by line resistance can be prevented. In the side section of the FPC 21, the terminal for analog power supply 23c is disposed at the inner side and next to the terminal for GND 24c, and on the source drive IC as well. The bump for analog power supply 2b is provided at the inner side and next to the bump for GND 1b. By this, the line length for the analog power supply 23d, where the second highest current next to the line for GND 24d flows, can also be decreased, and line resistance can be decreased.

Third Embodiment

Figure 11:
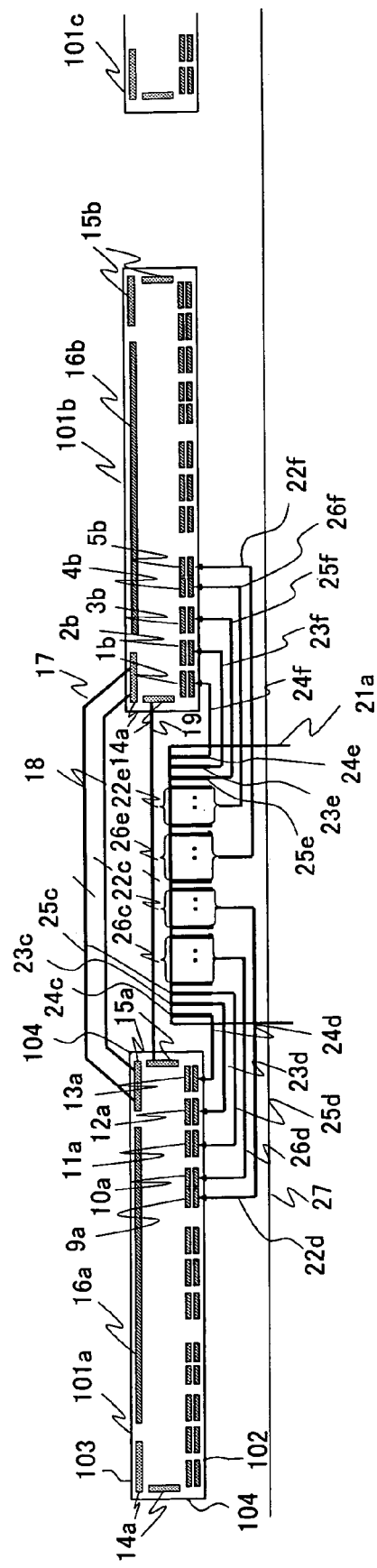
FIG. 11 is a plan view depicting a configuration of an area around the bumps for input provided on the source driver IC of the liquid crystal display device according to the third embodiment of the present invention.

The present embodiment will be described with reference to FIG. 11. FIG. 11 is a plan view depicting the configuration of the area around the bumps for input provided on the source driver IC of the liquid crystal display device. Compared with the first embodiment, the configuration between the FPC 21 and the bumps for input is different in the present embodiment, and description will be omitted for the configuration the same as the first embodiment.

According to the present embodiment, an FPC 21 is mounted at every other space between the source driver ICs, so that one FPC 21 is connected to two source driver ICs. This FPC 21a supplies all the signals and power for operating both the source driver IC 101a and the source driver IC 101b at the left and right. In other words, terminals for connecting with the source driver IC 101a are provided in the side section at the left of the FPC 21, which connect with the respective bumps for input of the source driver IC 101a via the line for input on the glass substrate. In the source driver IC 101a, the block at the right of the bumps for input is used. In the side section at the right of the FPC 21, terminals for connecting with the source driver IC 101b are provided, which are connected with the respective bumps for input of the source driver IC 101b via the lines on the glass substrate. In the source driver IC 101b, the block at the left of the bumps for input is used. On the glass substrate, lines for input for GND 24, analog power supply 23, digital power supply 25, reference voltage at the negative polarity side 26, and reference voltage at the positive polarity side 22 are provided on both the side sections of the FPC. In this configuration, roughly half of the FPCs 21 on the source driver IC 101 are connected. By this configuration, the number of connection locations of the FPC 21 can be decreased to half, so the number of components can be decreased, and the FPC mounting time for connection can be decreased. As a result, manufacturing cost can be decreased.

In the side section at the left of the FPC, the terminal for GND 24c, terminal for analog power supply 23c, and terminal for digital power supply 25c are provided in this sequence from the outer side. This sequence is the sequence of the terminals to which higher current flows, so the line length can be decreased for the sequence of the line for GND 24d, analog power supply 23d, and digital power supply 25d. At the inner side of these terminals, the terminal for reference voltage at the negative polarity side 26c and the terminal for reference voltage at the positive polarity side 22c are provided. By providing the terminals for the GND and the power supply system at the outer side of the terminals for the reference signal system, the drop of voltage, due to the deterioration of the line resistance, can be minimized.

Fourth Embodiment

Figure 12:
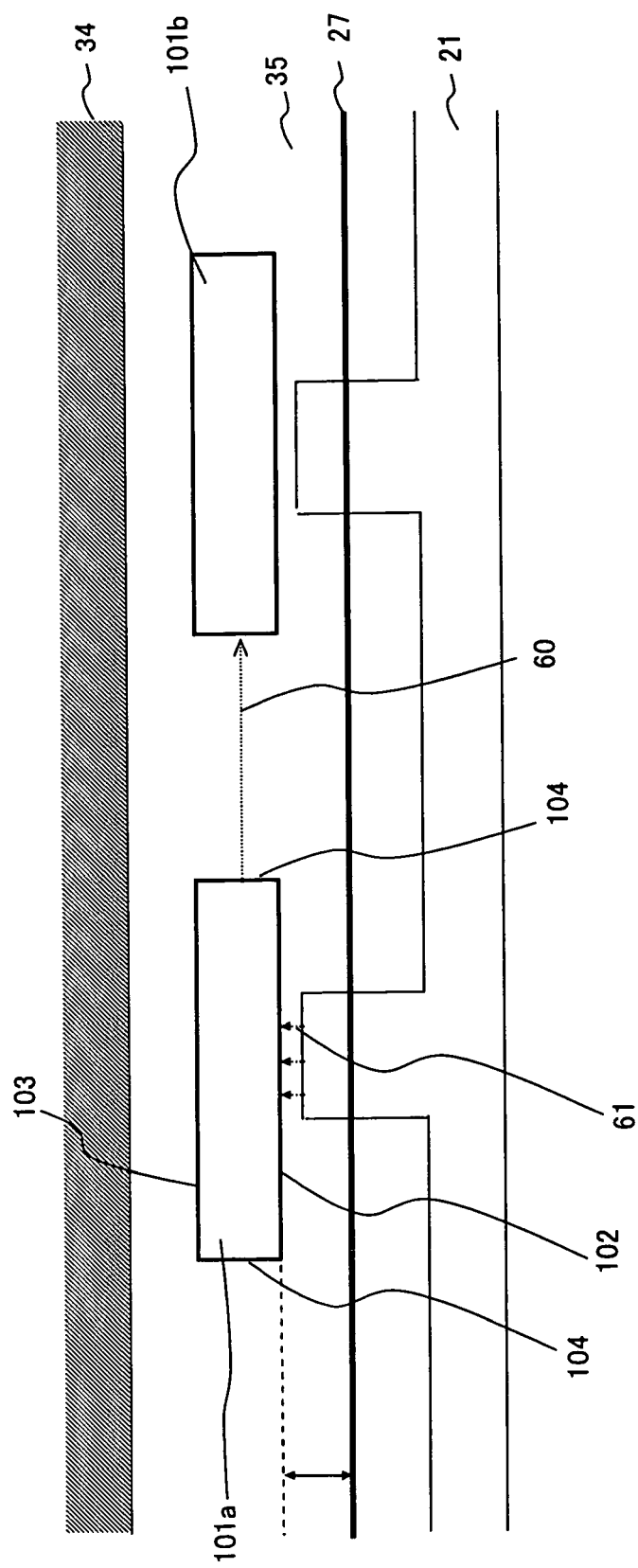
FIG. 12 is a plan view depicting a configuration of the end portion of the liquid crystal display panel of the liquid crystal display device according to the fourth embodiment of the present invention.

According to the present embodiment, the FPC 21 is installed at the substrate end side of the location where the source driver IC 101 is provided, facing the source driver IC 101, as shown in FIG. 12. In this case, the FPC 21 is installed corresponding to each source driver IC 101, so the number of source driver ICs 101 and the number of locations where the FPC 21 is connected are the same. And the FPC 21 is installed on the glass substrate at the substrate end side of the source driver IC 101. For this source driver IC 101, the source driver IC 101, having the bump array shown in FIG. 3, is used, and is connected with the glass substrate 27 via the ACF.

Figure 13:
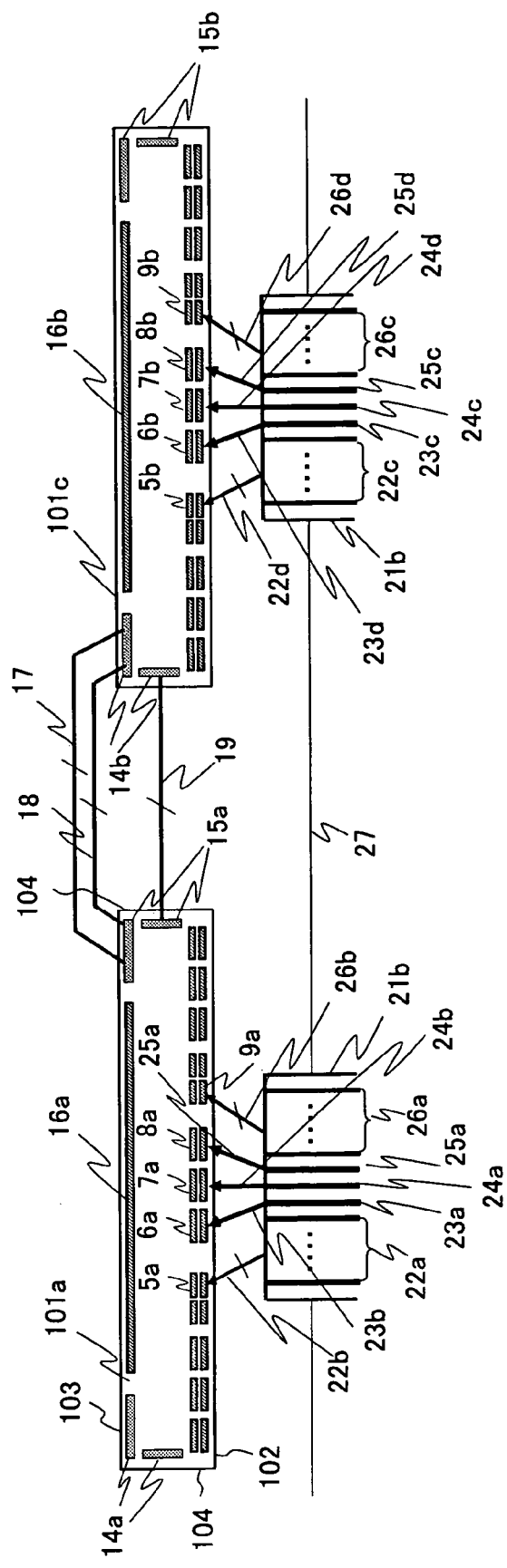
FIG. 13 is a plan view depicting a configuration of an area around the bumps for input provided on the source driver IC of the liquid crystal display device according to the fourth embodiment of the present invention.
Figure 14:
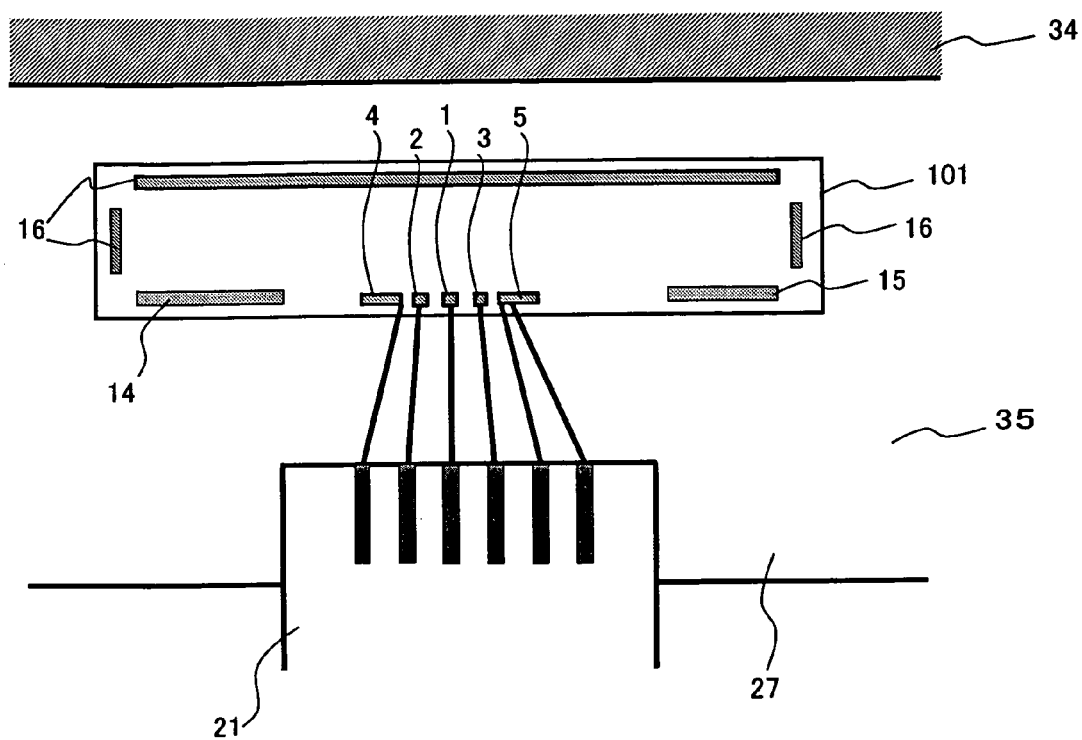
FIG. 14 is a plan view depicting a configuration of an area around the bumps for input provided on the source driver IC of a conventional liquid crystal display device.

The configuration of the area around the bumps for input will be described with reference to FIG. 13. FIG. 13 is a plan view depicting the area around the bumps for input provided on the source driver IC of the liquid crystal display device. In the present embodiment, the FPC 21 is connected near the center of the long side of the source driver IC 101. For the connection of the FPC 21b and the GND 24b, analog power supply 23b and digital power supply 25b, the center block (bump for GND 7a, bump for analog power supply 6a, and bump for digital power supply 8a) is used in the bumps for input of the source driver IC 101. For the reference voltage, the bump for reference voltage at the positive polarity side 9 and the bump for reference voltage at the negative polarity side 5, which are disposed on both sides of the central block, are used. On the FPC 21, the terminal for reference voltage at the negative polarity side 22a, terminal for analog voltage 23a, terminal for GND 24a, terminal for digital power supply 25a, and terminal for reference voltage at the negative positive polarity side 26a are provided from the left in this sequence. At the center of the FPC 21b, the terminal for GND 24a is provided. At the center of the long side 102 of the source driver IC 101a, the bump for GND 7a, to be connected with the terminal for GND 24a via the GND 24b, is provided. Positions of the bump for GND 7a and the terminal for GND 24a are aligned. Therefore the line for the GND 24b becomes perpendicular to the substrate end, and the line length can be decreased compared with other lines. In the same way, the lines for the digital power supply and the analog power supply can be made shorter than the lines for the reference voltage. By this, a drop of display quality, due to the deterioration of line resistance, can be prevented. By providing bumps for lines where the highest current flows, at the center of the long end of the source driver IC, and the terminals of the FPC 21 are provided at the center so as to correspond to these bumps, as described above, a drop of display quality, due to line resistance, can be prevented.

In this way, by using a source driver IC according to the present invention, both disposing the FPC between the source driver ICs and disposing it facing the source driver IC becomes possible. By using the source driver IC having such a bump array, the resistance value can be decreased in the configuration of the source driver IC, the lines for input and the FPC 21 on the glass substrate, even if the packaging space is restricted. For example, a plurality of source driver ICs 101 can easily be mounted at equal spacing, so that resistance in the logic signal line between the source driver ICs can be uniform, and the display quality can be improved. For both the configuration of the mounting the FPC between the source driver ICS and the configuration of facing the source driver ICs and FPCs, the same source driver ICs can be used, and the source driver ICs can be common. This can decrease the manufacturing cost of the source driver ICs.

The pitch of the bumps for input of the source driver IC 101 is much smaller than the terminal pitch of the FPC 21. By setting the pitch of the bumps for input to be close to the terminal pitch of the FPC 21, the line length required for making the each line to be perpendicular to the substrate end can be decreased. The pitch of the bumps for input can be changed by adjusting the number of bumps provided in the respective bumps for input shown in FIG. 4. By this, the output errors due to a drop of voltage to the source driver IC can be decreased. Also according to the present invention, the FPC is not connected between the source driver ICs, so the space between each source driver IC can be decreased, and the line resistance value of the cascade-connected logic signal lines can be decreased, and high-speed transmission of the signals on the glass substrate becomes possible.

Other Embodiments

The present invention is not limited to the above mentioned embodiments, but can be modified in various ways. For example, in the above mentioned embodiments, the configuration of the lines, bumps and terminals in the reference voltage at the positive polarity side and the reference voltage at the negative polarity side may be reversed. In the embodiments, the current that flows through the line for GND 24 is the highest, but if the highest current flows through a different line, then the bump thereof can be provided at the furthest outer side. In the same way, the terminal of that line in FPC may be provided to be closest to the side section. Needless to say, the present invention can be applied not only to the source driver IC 101 but also to the gate driver IC.

In the above mentioned embodiments, the number of FPCs is the number of locations where the FPC and the glass substrate are connected. In other words, if one FPC is branched outside the glass substrate and connected to the glass substrate, the number of connection locations is regarded as the number of FPCs. The terminals of the FPC may be at the left and right sides reversed symmetrically in the configuration. With this configuration as well, the line resistance value in line on the glass substrate can be decreased, and logic processing and desired voltage can be output normally in the source driver IC. Even if the FPC is connected between the source driver ICs, the line length from the substrate end to the center between the source driver ICs can be decreased, and the line resistance value can be decreased. And by disposing the clock line at the center of the image data lines, the influence of waveform distortion, due to line resistance of the data and clock lines, can be suppressed. Also by packaging the FPC between the source driver ICs, liquid crystal devices can be manufactured without increasing the panel size.

According to the present invention, a display device with a narrow screen border area and with excellent display quality can be provided.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A display device, comprising:
   a display panel comprising an insulation substrate;
   a plurality of drive circuits disposed at an end portion of the insulation substrate along an edge of the insulation substrate and configured to transfer a plurality of output signals to the display panel, the plurality of drive circuits including a first drive circuit and a second drive circuit;
   a plurality of spaces between the circuits, the plurality of drive circuits each being separated from each other by one or more of the spaces between the circuits, the plurality of spaces between the circuits including a first space which separates the first drive circuit from the second drive circuit;
   a plurality of line sections including a first line section placed within the first space, the first line section having a plurality of external lines for supplying signals and power to the first drive circuit and the second drive circuit, the plurality of external lines including a high current external line; and
   a plurality of input lines formed on the insulation substrate and connected with corresponding lines of the plurality of external lines, the plurality of input lines configured to transport one or more of the signals and the power to the first drive circuit and the second drive circuit, the plurality of input lines including a high current input line connected to the first drive circuit, the high current input line carrying more current than any other of the plurality of input lines that are connected to the first drive circuit, the high current input line being connected to the high current external line,
   wherein the high current external line is placed at a side of the line section closest to the first drive circuit.

2. The display device according to claim 1, wherein the first drive circuit comprises a plurality of bumps for input formed at an edge side of the insulation substrate along an edge and connected with a line corresponding to the plurality of input lines, and a high current bump for input corresponding to the high current input line is placed at an outermost side of the first drive circuit.

3. The display device according to claim 2, wherein the bumps for input comprise
   a bump for GND,
   a bump for power supply, and
   a bump for reference voltage,
   wherein the bump for GND and the bump for power supply are placed together as a first block at a side section of the first drive circuit and as a second block at a center of the first drive circuit, and the bump for reference voltage is disposed between the first block and the second block.

4. The display device according to claim 3, wherein the bump for GND and the bump for power supply are electrically connected with the bump for GND and the bump for power supply in a different block, respectively, in the first drive circuit.

5. The display device according to claim 3, wherein the bump for GND or the bump for power supply in ene the first block comprises electrically connected two rows of bumps.

6. The display device according to claim 1, wherein each of the plurality of line sections are disposed at every other space between the plurality of drive circuits, and each of the plurality of line sections are connected with bumps for input of two nearest drive circuits of the plurality of the drive circuits.

7. A display device, comprising:
   a rectangular insulation substrate having a bottom substrate edge and a vertical substrate edge, the rectangular insulation substrate including a rectangular display area having a plurality of pixels;
   a control circuit section configured to provide a power supply and a plurality of signals to the plurality of pixels;
   a plurality of source drivers disposed on the insulation substrate via an anisotropic conductive film, the plurality of source drivers are disposed between the rectangular display area and the bottom substrate edge, the plurality of source drivers each having a long circuit side and a short circuit side, the long circuit side of the plurality of source drivers being parallel to and equidistant from the bottom substrate edge, the plurality of source drivers each separated by a separation width, the plurality of source drivers configured to provide the power supply to the plurality of pixels, the plurality of source drivers including a first source driver and a second source driver, and the plurality of source drivers each having a bottom face;

a flexible printed circuit mounted on the insulation substrate between the rectangular display area and the bottom substrate edge, the flexible printed circuit includes a plurality of external lines configured to supply power and signals from the control circuit section to the plurality of source drivers, the flexible printed circuit including a flexible printed circuit tip disposed between the first source driver and the second source driver, and each of the plurality of external lines are connected independently to a plurality of terminals adjacent to the flexible printed circuit tip; and a plurality of input lines formed on the insulation substrate, the plurality of input lines configured to connect a first plurality of driver bumps for input on the bottom face of the first source driver and a second plurality of driver bumps for input on the bottom face of the second source driver to the plurality of terminals.

8. The display device of claim 7, wherein the plurality of external lines include an external GND line configured to be electrically connected to a first input line through a first terminal, an external analog power supply line configured to be electrically connected to a second input line through a second terminal, an external digital power supply line configured to be electrically connected to a third input line through a third terminal, an external reference voltage at a positive polarity side line configured to be electrically connected to a fourth input line through a fourth terminal, and an external reference voltage at a negative polarity side line configured to be electrically connected to a fifth input line through a fifth terminal, wherein the plurality of input lines include the first input line, the second input line, the third input line, the fourth input line, and the fifth input line, and wherein the plurality of terminals include the first terminal, the second terminal, the third terminal, the fourth terminal, and the fifth terminal.

9. The display device of claim 8, wherein the plurality of input lines are formed parallel to the bottom substrate edge, and wherein the first input line is electrically connected to a first bump formed on the second source driver, the second input line is electrically connected to a second bump formed on the second source driver, the third input line is electrically connected to a third bump formed on the first source driver, the fourth input line is electrically connected to a fourth bump formed on the first source driver, and the fifth input line is electrically connected to a fifth bump formed on the first source driver.

10. The display device of claim 8, wherein the plurality of input lines are formed parallel to the bottom substrate edge, and wherein the plurality of external lines also include a second external reference voltage at the positive polarity side line configured to be electrically connected to a sixth input line through the sixth terminal, and a second external reference voltage at the negative polarity side line configured to be electrically connected to a seventh input line through the seventh terminal, and wherein the first input line is electrically connected to a first bump formed on the first source driver, the second input line is electrically connected to a second bump formed on the first source driver, the third input line is electrically connected to a third bump formed on the first source driver, the fourth input line is electrically connected to a fourth bump formed on the first source driver, the fifth input line is electrically connected to a fifth bump formed on the first source driver, the sixth input line is electrically connected to a sixth bump formed on the second source driver, and seventh input line is electrically connected to a seventh bump formed on the second source driver.

11. The display device of claim 10, wherein the first source driver and the second source driver are electrically connected by a plurality of cascade lines formed on the insulation substrate, and the cascade lines include a control signal line, an image data signal line, and a clock signal line disposed between the control signal line and the image data signal line.

* * * * *